US012757408B2

(12) United States Patent
Servalli et al.

(10) Patent No.: US 12,757,408 B2
(45) Date of Patent: Oct. 6, 2026

(54) FERROELECTRIC MEMORY ARCHITECTURE WITH GAP REGION

(71) Applicant: Micron Technology, Inc., Boise, ID (US)

(72) Inventors: Giorgio Servalli, Fara Gera d'Adda (BG) (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 494 days.

(21) Appl. No.: 18/204,077

(22) Filed: May 31, 2023

(65) Prior Publication Data

US 2023/0397436 A1 Dec. 7, 2023

Related U.S. Application Data

(60) Provisional application No. 63/347,847, filed on Jun. 1, 2022.

(51) Int. Cl.

| | |
|---|---|
| ***H10B 53/30*** | (2023.01) |
| ***G11C 11/22*** | (2006.01) |
| ***H10B 53/40*** | (2023.01) |

(52) U.S. Cl.

CPC ............. *H10B 53/30* (2023.02); *H10B 53/40* (2023.02); *G11C 11/2273* (2013.01)

(58) Field of Classification Search

CPC .... H10B 53/30; H10B 53/40; G11C 11/2273; G11C 11/2259; G11C 11/221

See application file for complete search history.

(56) References Cited

U.S. PATENT DOCUMENTS

| | | | | |
|---|---|---|---|---|
| 5,373,463 | A * | 12/1994 | Jones, Jr. | G11C 11/22 365/228 |
| 2017/0170237 | A1* | 6/2017 | Jung | H10N 50/10 |
| 2020/0127053 | A1* | 4/2020 | Chen | H10B 53/30 |
| 2021/0376231 | A1* | 12/2021 | Yin | H10N 50/01 |

* cited by examiner

*Primary Examiner* — Allison Bernstein
(74) *Attorney, Agent, or Firm* — Holland & Hart LLP

(57) ABSTRACT

Methods, systems, and devices for a ferroelectric memory architecture are described. A memory architecture may include a gap region between memory cells to reduce a capacitance between plates coupled with the memory cells. The gap region may include a fluid, such as air, which may have a relatively low dielectric constant to reduce a capacitance between plates and reduce (e.g., eliminate) undesirable coupling between plates during memory operations. Implementing the gap region between memory cells enables a memory device to increase speed and reduce resource consumption associated with memory operations.

18 Claims, 16 Drawing Sheets

500

FERROELECTRIC MEMORY ARCHITECTURE WITH GAP REGION

CROSS REFERENCE

The present Application for Patent claims the benefit of U.S. Provisional Patent Application No. 63/347,847 by Servalli et al., entitled "FERROELECTRIC MEMORY ARCHITECTURE WITH GAP REGION," filed Jun. 1, 2022, assigned to the assignee hereof, and expressly incorporated by reference herein.

FIELD OF TECHNOLOGY

The following relates to one or more systems for memory, including a ferroelectric memory architecture.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory, but may have non-volatile properties due to the use of a ferroelectric capacitor as a storage device.

DETAILED DESCRIPTION

In ferroelectric random access memory (FeRAM) and hybrid FeRAM architectures, a memory cell may include a capacitor that includes a ferroelectric material to store a charge, or a polarization, or both, representative of a programmable logic state. The memory cell may include a logic storage component, such as a capacitor, and a switching component (e.g., a selection component). Each memory cell may be coupled with one or more access lines, including a digit line (e.g., a bit line), a word line, a plate line, or any combination thereof. In some cases, an array of memory cells may have a relatively large capacitance between plates, for example, based on dielectric materials supporting the array or a dielectric constant of the logic storage components of the memory cells, among other factors. It may be beneficial to reduce the capacitance between plates, for example, to improve efficiency of memory operations.

In accordance with examples as disclosed herein, a memory architecture may include a gap region between memory cells to reduce a capacitance between plates coupled with the memory cells. The gap region may include a substance, which may be fluid, such as air. This substance (e.g., fluid such as air) may have a relatively low dielectric constant to reduce a capacitance between plates and may reduce (e.g., eliminate) undesirable coupling between plates during memory operations. Implementing the gap region between memory cells enables a memory device to increase speed and reduce resource consumption associated with memory operations, among other advantages.

Figure 1:
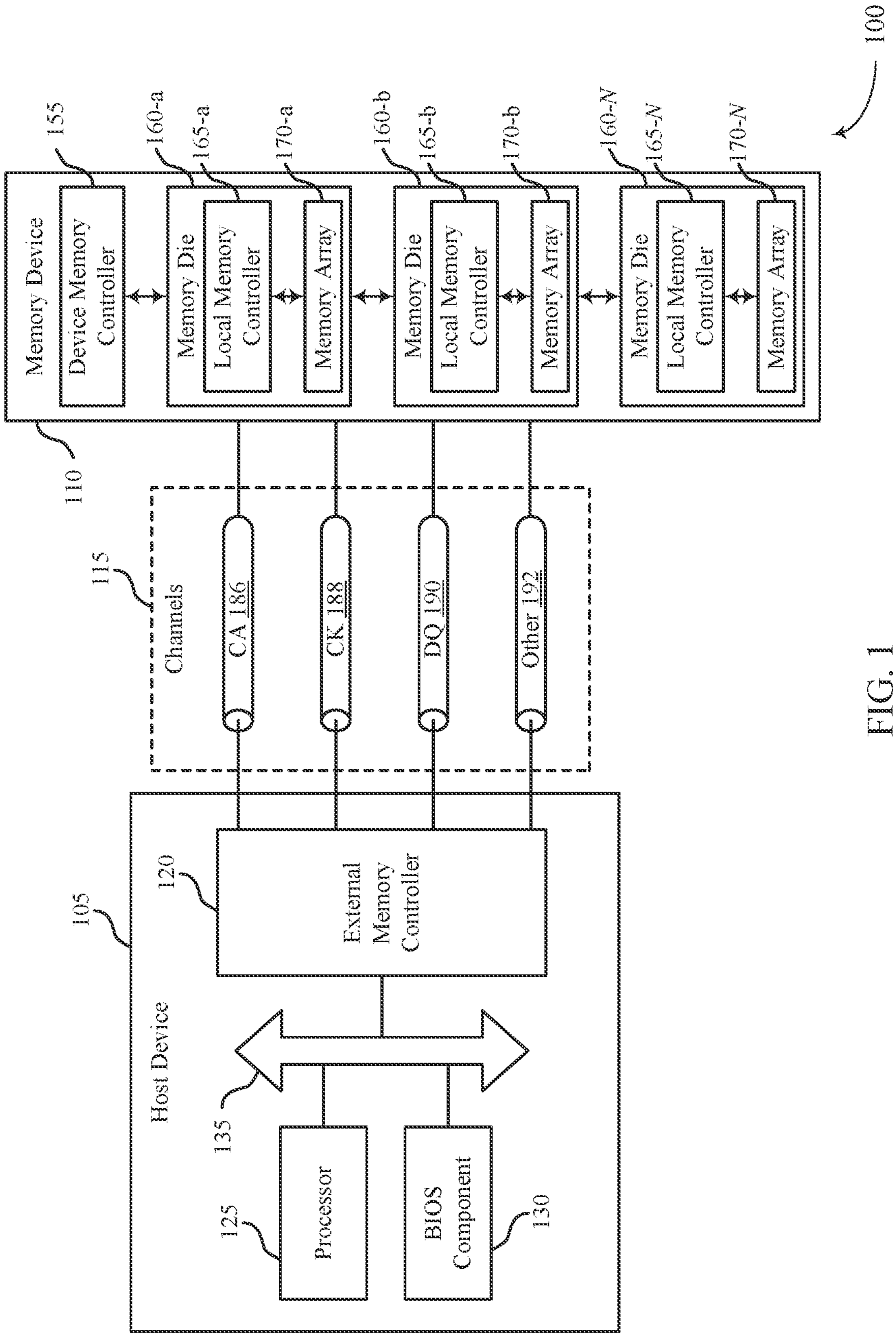
FIG. 1 illustrates an example of a system that supports a ferroelectric memory architecture in accordance with examples as disclosed herein.
Figure 2:
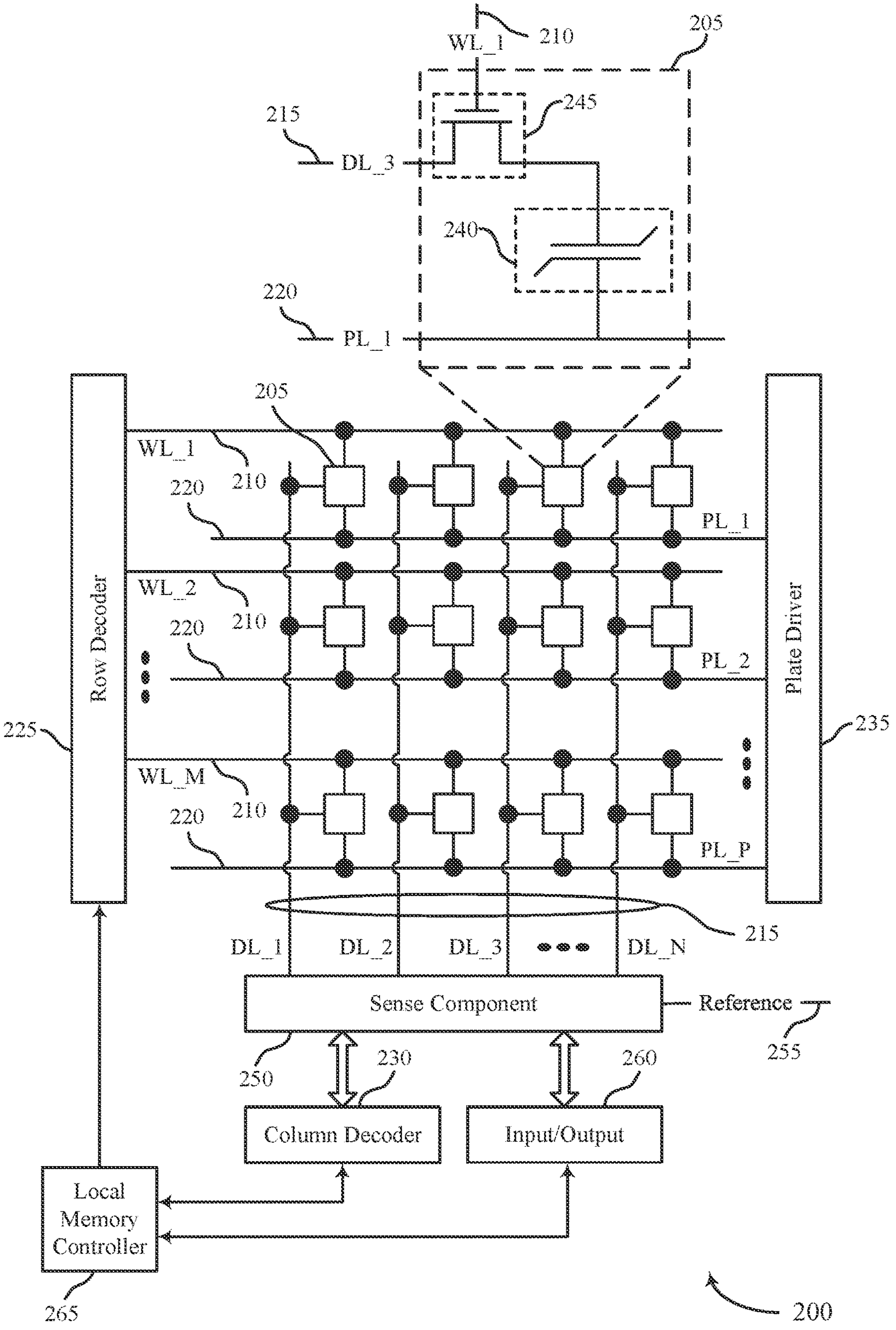
FIG. 2 illustrates an example of a memory die that supports a ferroelectric memory architecture in accordance with examples as disclosed herein.
Figure 3:
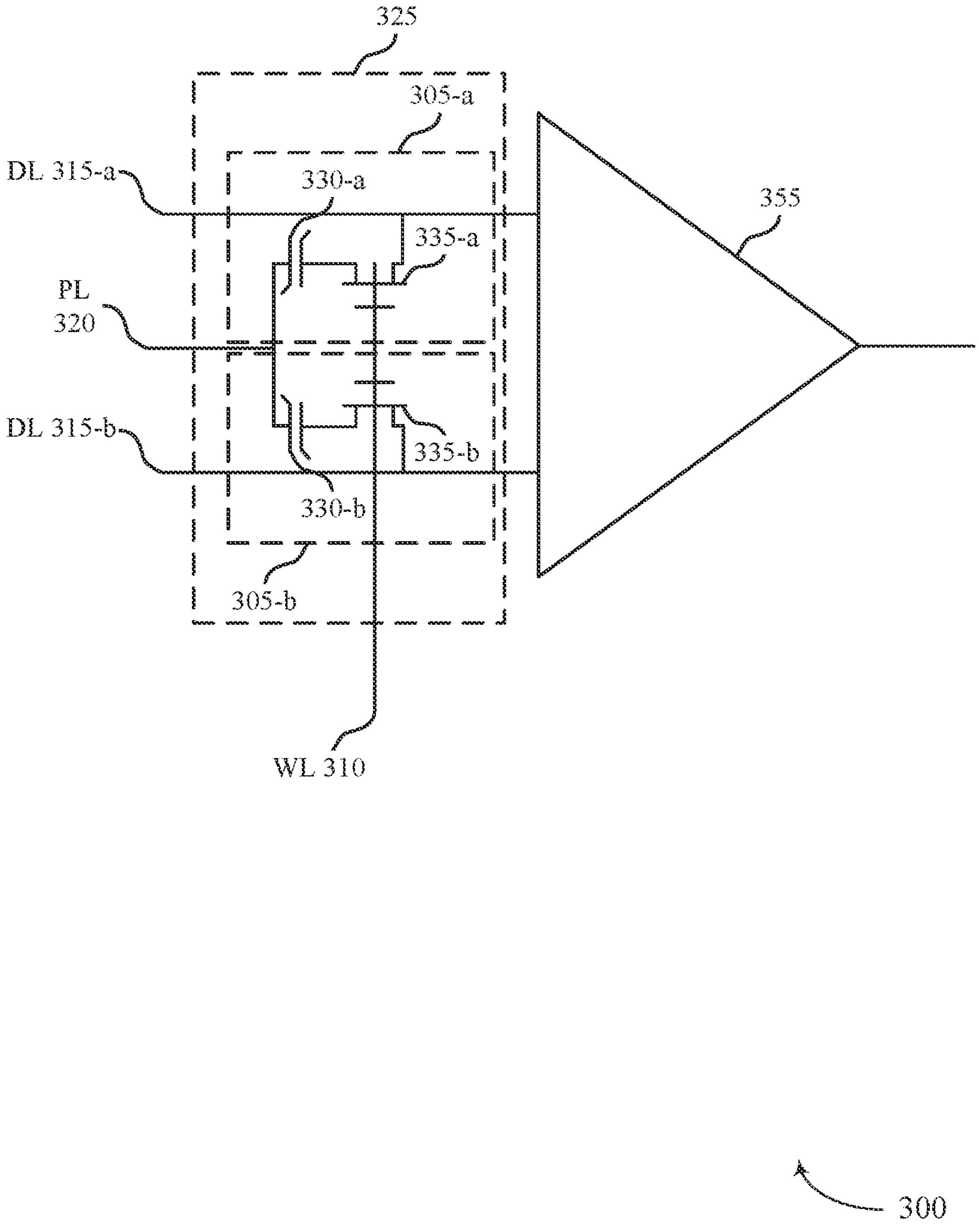
FIG. 3 illustrates an example of a memory array that supports a ferroelectric memory architecture in accordance with examples as disclosed herein.

Features of the disclosure are initially described in the context of systems and dies with reference to FIGS. 1 through 3. Features of the disclosure are described in the context of processing steps of a method for forming a ferroelectric memory architecture with reference to FIGS. 4A-4L. These and other features of the disclosure are further illustrated by and described with reference to an apparatus diagram and flowcharts that relate to a ferroelectric memory architecture as described with reference to FIG. 5.

FIG. 1 illustrates an example of a system 100 that supports a ferroelectric memory architecture in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes (where such "other circuitry" is hereinafter also referred to in the specification and claims as a "processor"), such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In accordance with examples as disclosed herein, memory arrays 170 of a memory device 110 may include a gap region between memory cells to reduce a capacitance between plates coupled with the memory cells. The gap region may include a substance, which may be a material or a fluid, such as air, which substance may have a relatively low dielectric constant to reduce a capacitance between plates, and which may reduce (e.g., eliminate) undesirable coupling between plates during memory operations at the memory device 110. Implementing the gap region between memory cells may enable the memory device 110 to increase speed and reduce resource consumption associated with memory operations.

FIG. 2 illustrates an example of a memory die 200 that supports a ferroelectric memory architecture in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating, respectively, the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

In accordance with examples as disclosed herein, the memory die 200 may include a gap region between memory cells 205 to reduce a capacitance between plates coupled with the memory cells 205 (e.g., plates coupled with the plate lines 220). The gap region may include a substance, which may be a material or a fluid, such as air, which substance may have a relatively low dielectric constant to reduce a capacitance between plates, and which may reduce (e.g., eliminate) undesirable coupling between plates during memory operations at the memory die 200. Implementing the gap region between memory cells 205 may enable the memory die 200 to increase speed and reduce resource consumption associated with memory operations (e.g., access operations on the memory cells 205).

FIG. 3 illustrates an example of a memory array 300 that supports a ferroelectric memory architecture in accordance with examples as disclosed herein. Memory array 300 may be an example of memory array 200 as described with reference to FIG. 2. Memory array 300 include examples of components as described with reference to FIG. 2. For example, the memory array 300 may include a memory cell 305, a word line 310, a digit line 315, a plate line 320, and a sense component 355 which may be examples of corresponding components described with reference to FIG. 2. In some examples, digit line 315 may also be an example of a global digit line.

A memory cell 305 may include a logic storage component, such as capacitor 330, and a switching component 335. The capacitor 330 may be an example of a ferroelectric capacitor. A first node of the capacitor 330 may be coupled with the switching component 335 and a second node of the capacitor 330 may be coupled with a plate line 320. In some examples, a memory cell pair 325 may be coupled with a single plate line 320. That is, memory cell 305-*a* and memory cell 305-*b* may both be coupled with the same plate line 320. In such examples, the memory cell pair 325 may be configured to store one bit of information (e.g., data). Additionally, or alternatively, memory cell 305-*a* and memory cell 305-*b* may be configured to store opposite logic states or charges—e.g., if memory cell 305-*a* stores a logic value '1', memory cell 305-*b* may store a logic value '0'. The switching component 335-*a* may be an example of a transistor or any other type of switch device that selectively establishes or de-establishes electronic communication between two components.

Selecting or deselecting the memory cell 305 may be accomplished by activating or deactivating, respectively, the switching component 335. The capacitor 330 may be in electronic communication with the digit line 315 using the switching component 335. For example, the capacitor 330 may be isolated from digit line 315 when the switching component 335 is deactivated, and the capacitor 330 may be coupled with digit line 315 when the switching component 335 is activated.

In some examples, the switching component 335 may be activated by a word line 310. A word line 310 may be configured to activate a memory cell pair 325 by activating a switching component 335-*a* of memory cell 305-*a* and a switching component 335-*b* of memory cell 305-*b*. In such examples, the memory cell pair 325 may be coupled with a digit line pair—e.g., memory cell 305-*a* may be coupled with digit line 315-*a* and memory cell 305-*b* may be coupled with digit line 315-*b*.

Sense component 355 may be configured to sense a logic state of memory cell pair 325 by determining a difference in a voltage of the memory cell 305-*a* and the memory cell 305-*b*. That is, when the switching components 335-*a* and 335-*b* are activated by the word line 310, memory cell 305-*a* may transfer charge from the capacitor 330-*a* to the digit line 315-*a* and memory cell 305-*b* may transfer charge form the capacitor 330-*b* to the digit line 315-*b*. In such examples, the sense component 355 may receive a first charge or first voltage from digit line 315-*a* associated with memory cell 305-*a* and a second charge of second voltage from the digit line 315-*b* associated with memory cell 305-*b*. The sense component 355 may then determine a logic state of the memory cell 305-*a* based on a difference between the first charge or first voltage and the second charge or second voltage—e.g., if memory cell 305-*a* has a greater charge than memory cell 305-*b* the sense component 355 may determine a logic state '1' for the memory cell pair 325 and if the memory cell 305-*b* has a greater charge than memory cell 305-*a* the sense component may determine a logic state '0' for the memory cell pair 325. Because the sense component 355 determines a logic state based on both the first memory cell 305-*a* and the second memory cell 305-*b*, a likelihood of inaccurate sensing due to an uppermost voltage of a first logic state distribution being greater than a lowermost voltage of a second logic state voltage may be reduced. In a differential system (such as the memory cell pair 325), sources of interference or errors are likely to affect the signals from both memory cells the same way. In contrast, in a single-ended system (e.g., with a single memory cell 305), sources of interference or errors may affect the signal from the memory cell differently than they affect the reference signal, thereby causing mismatches that may cause one or more errors.

In accordance with examples as disclosed herein, the memory array 300 may include a gap region between memory cells 305 (or between memory cell pairs 325) to reduce a capacitance between plates coupled with the memory cells 305. The gap region may include a substance, which may be a material or a fluid, such as air, which substance may have a relatively low dielectric constant to reduce a capacitance between plates, and which may reduce (e.g., eliminate) undesirable coupling between plates during memory operations at the memory array 300. Implementing the gap region between memory cells 305 may enable the memory die 200 to increase speed and reduce resource consumption associated with memory operations (e.g., access operations on the memory cells 305, access operations on the memory cell pair 325).

FIGS. 4A through 4L illustrate examples of processing steps 400 of a method for forming a ferroelectric memory architecture in accordance with examples as disclosed herein. The processing steps 400 illustrate various planar views 401 horizontal cross-sectional views 402, and vertical cross-sectional views 403 of materials on a transistor array 404. Various cross-sections depicted in FIGS. 4A through 4L are denoted by the corresponding line in related images on the same sheet.

Figure 4A:
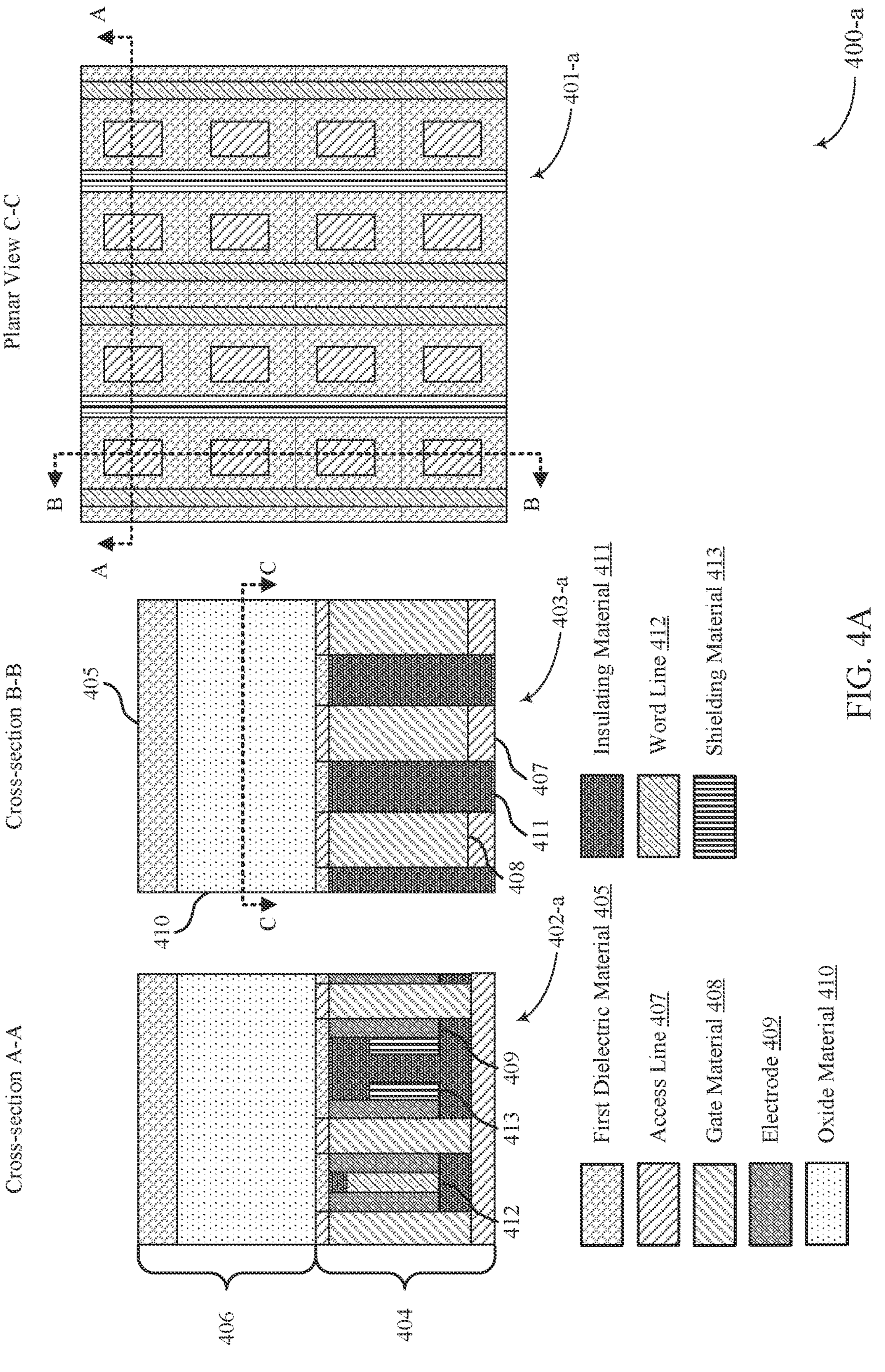
FIGS. 4A-4L illustrate examples of processing steps of a method for forming a ferroelectric memory architecture in accordance with examples as disclosed herein.

In FIG. 4A, processing step 400-*a* is depicted and includes a planar view 301-*a*, a horizontal cross-sectional view 402-*a*, and a vertical cross-sectional view 403-*a* of the ferroelectric memory architecture. The horizontal cross-sectional view 402-*a* is taken along the line A-A of the planar view 401-*a*, and the vertical cross-sectional view 403-*a* is taken along the line B-B of the planar view 401-*a*. Further, the planar view 401-*a* is taken along the line C-C of the vertical cross-sectional view 403-*a*. In the processing step 400-*a*, a stack 406 of materials may be formed on a transistor array 404. The stack 406 may include a first dielectric material 405 (e.g., a nitride material) and an oxide material 410. The transistor array 404 may include one or more access lines 407 (e.g., bit lines, digit lines) coupled with an access line decoder, a sense component, or both. Each access line 407 may be coupled with a source or a drain of a respective transistor of the transistor array 404. Each transistor may also include a gate material 408, which may be activated by a word line 412 coupled with the gate material 408 via an electrode 409. In some examples, gate materials 408 of two transistors may be coupled with a common word line 412. In some examples, the transistor array 404 may include one or more materials, such as an insulating material 411, a shielding material 413, or both, to isolate (e.g., electrically isolate) the transistors from one another or provide electrostatic shielding for the transistor array 404. In some examples, each transistor of the transistor array 404 may be a thin film transistor (TFT).

Figure 4B:
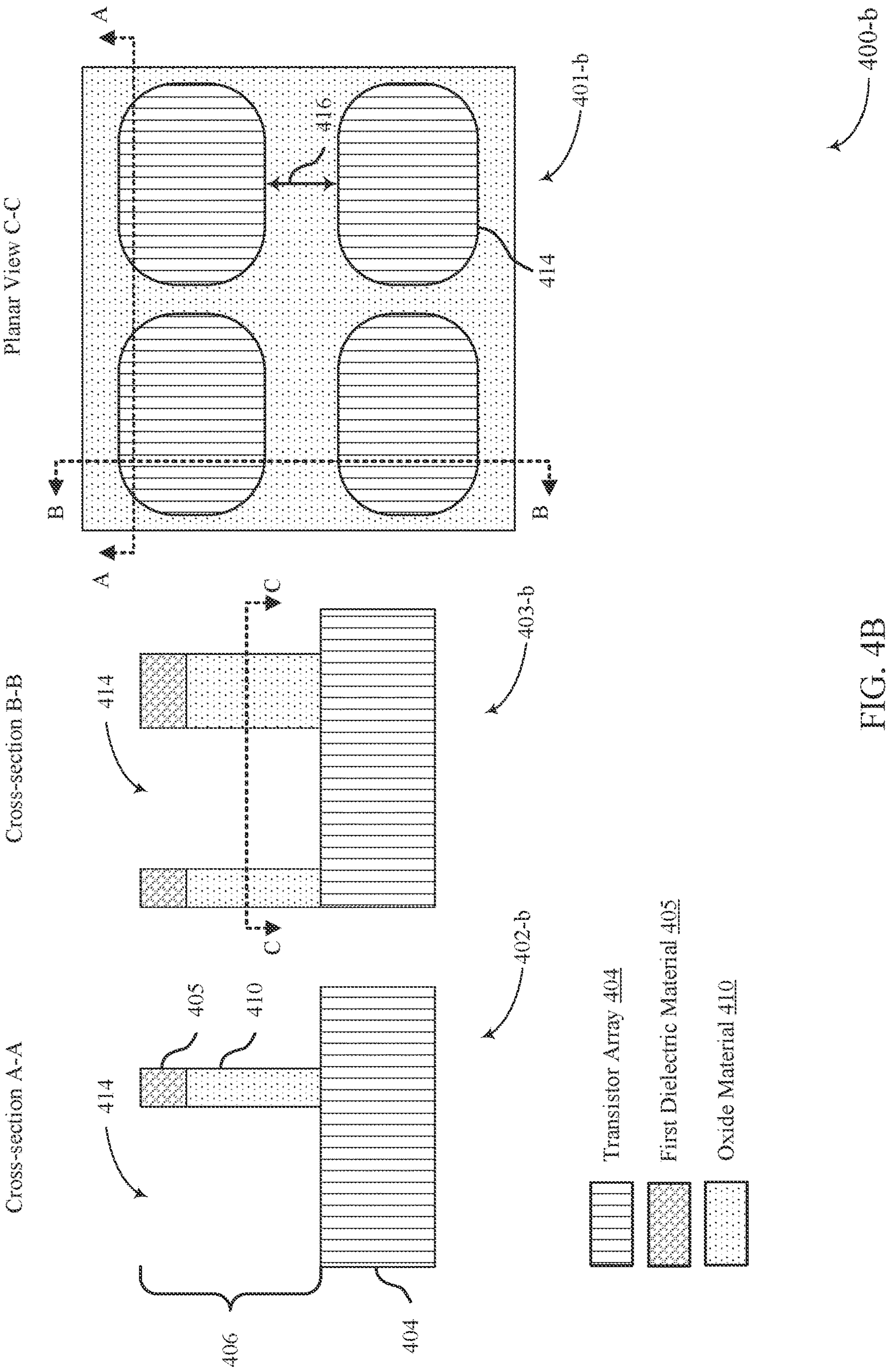

In FIG. 4B, processing step 400-*b* is depicted and includes a planar view 301-*b*, a horizontal cross-sectional view 402-*b*, and a vertical cross-sectional view 403-*b* of the ferroelectric memory architecture. The horizontal cross-sectional view 402-*b* is taken along the line A-A of the planar view 401-*b*, and the vertical cross-sectional view 403-*b* is taken along the line B-B of the planar view 401-*b*. Further, the planar view 401-*b* is taken along the line C-C of the vertical cross-sectional view 403-*b*. In the processing step 400-*b*, the stack 406 of materials may be etched (e.g., using a wet etch process, using a dry etch process) to form a set of cavities 414. For example, the stack 406 may be etched down to a surface of TFT pillars in the transistor array 404. In some examples, the etch may be performed using a contact mask to form the cavities 414 with a determined shape. For example, the cavities 414 may be formed with a rounded square shape. In some examples, the cavities 414 may be separated by a distance 416 (e.g., 20 nanometers (nm)) in a first direction to allow for plate cuts (e.g., in another processing step 400).

Figure 4C:
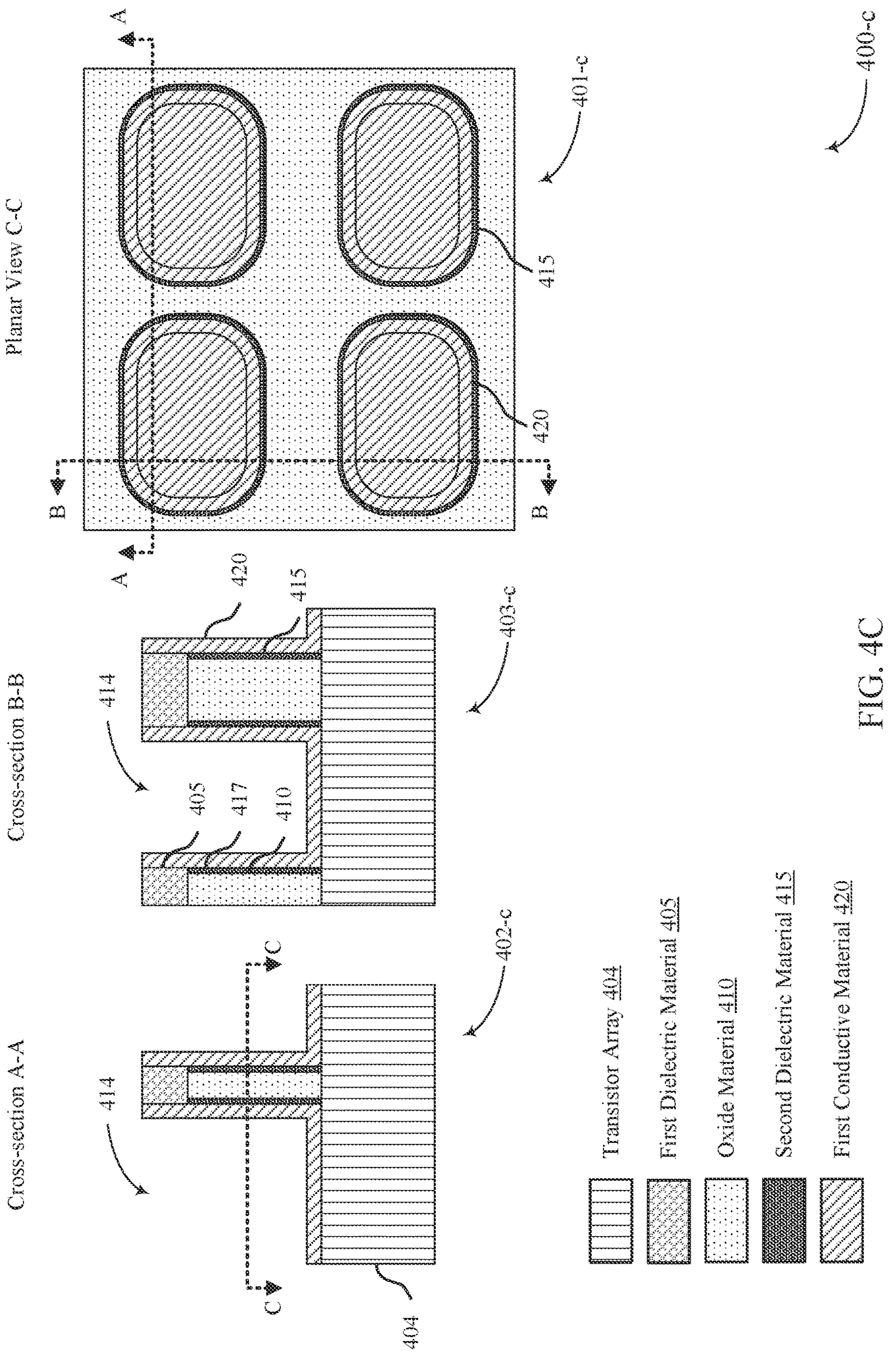

In FIG. 4C, processing step 400-*c* is depicted and includes a planar view 301-*c*, a horizontal cross-sectional view 402-*c*, and a vertical cross-sectional view 403-*c* of the ferroelectric memory architecture. The horizontal cross-sectional view 402-*c* is taken along the line A-A of the planar view 401-*c*, and the vertical cross-sectional view 403-*c* is taken along the line B-B of the planar view 401-*c*. Further, the planar view 401-*c* is taken along the line C-C of the horizontal cross-sectional view 402-*c*. In the processing step 400-*c*, a second dielectric material 415 may be deposited to form sidewalls 417. For example, the second dielectric material 415 may be deposited in the set of cavities 414, then etched back to reform the set of cavities 414 and form the sidewalls 417 surrounding the cavities 414. In some examples, the second dielectric material 415 and the first dielectric material 405 may be a same material (e.g., a nitride material). After the sidewalls 417 are formed, a first conductive material 420 may be deposited in the set of cavities 414 and on the sidewalls 417 for form a set of electrodes (e.g., bottom electrodes for ferroelectric memory cells). In some examples, the first conductive material 420 may be deposited over the first dielectric material 405 and then etched back to expose the first dielectric material 405.

Figure 4D:
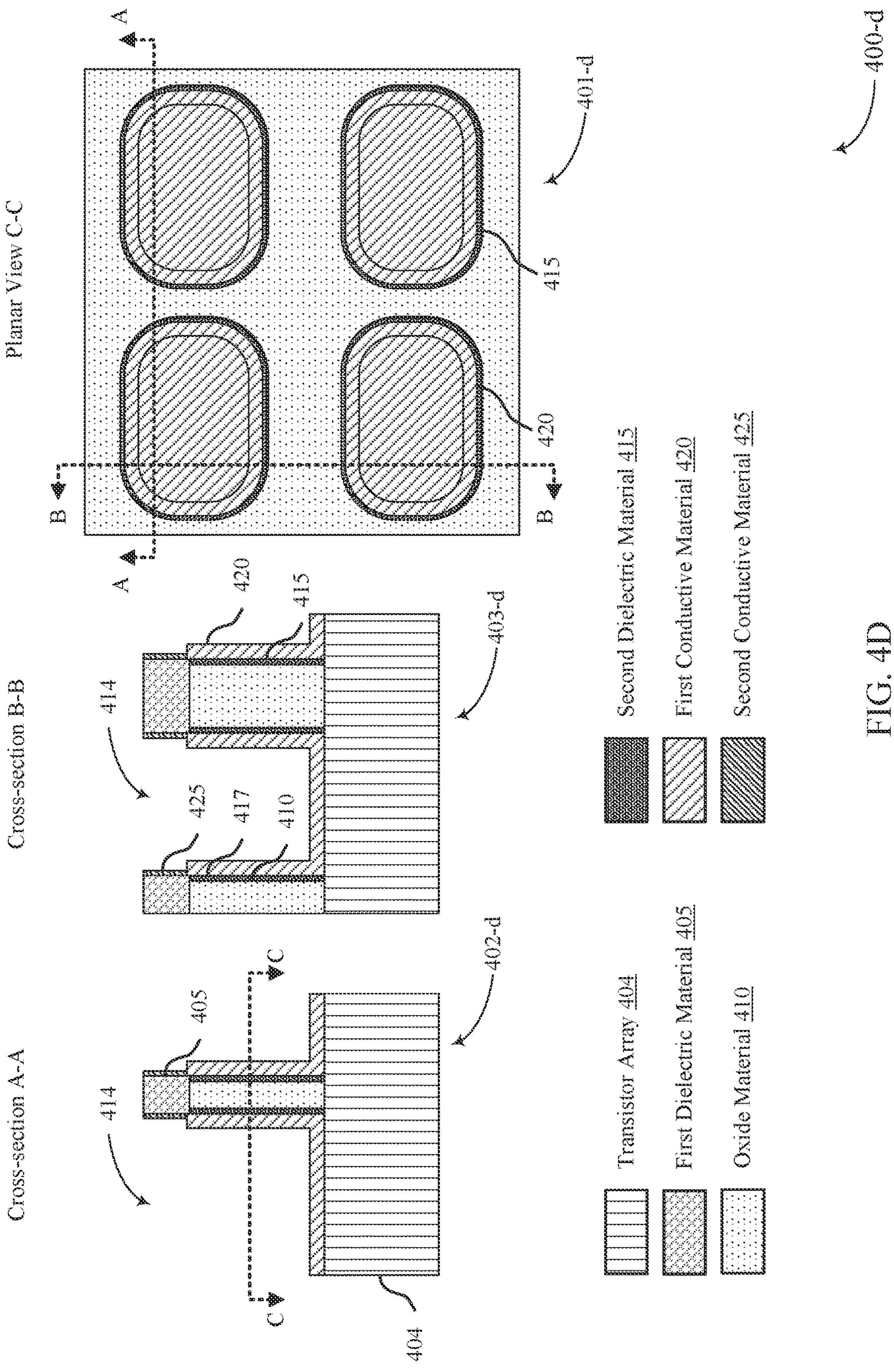

In FIG. 4D, processing step 400-*d* is depicted and includes a planar view 301-*d*, a horizontal cross-sectional view 402-*d*, and a vertical cross-sectional view 403-*d* of the ferroelectric memory architecture. The horizontal cross-sectional view 402-*d* is taken along the line A-A of the planar view 401-*d*, and the vertical cross-sectional view 403-*d* is taken along the line B-B of the planar view 401-*d*. Further, the planar view 401-*d* is taken along the line C-C of the horizontal cross-sectional view 402-*d*. In the processing step 400-*d*, the first conductive material 420 may be etched back to expose a portion of each sidewall 417. A second conductive material 425 may be deposited on the exposed portions of the sidewalls 417. The second conductive material 425 may be a leaker (e.g., a weak conductor) between the bottom electrode (e.g., the first conductive material 420) and a top electrode of a ferroelectric memory cell.

Figure 4E:
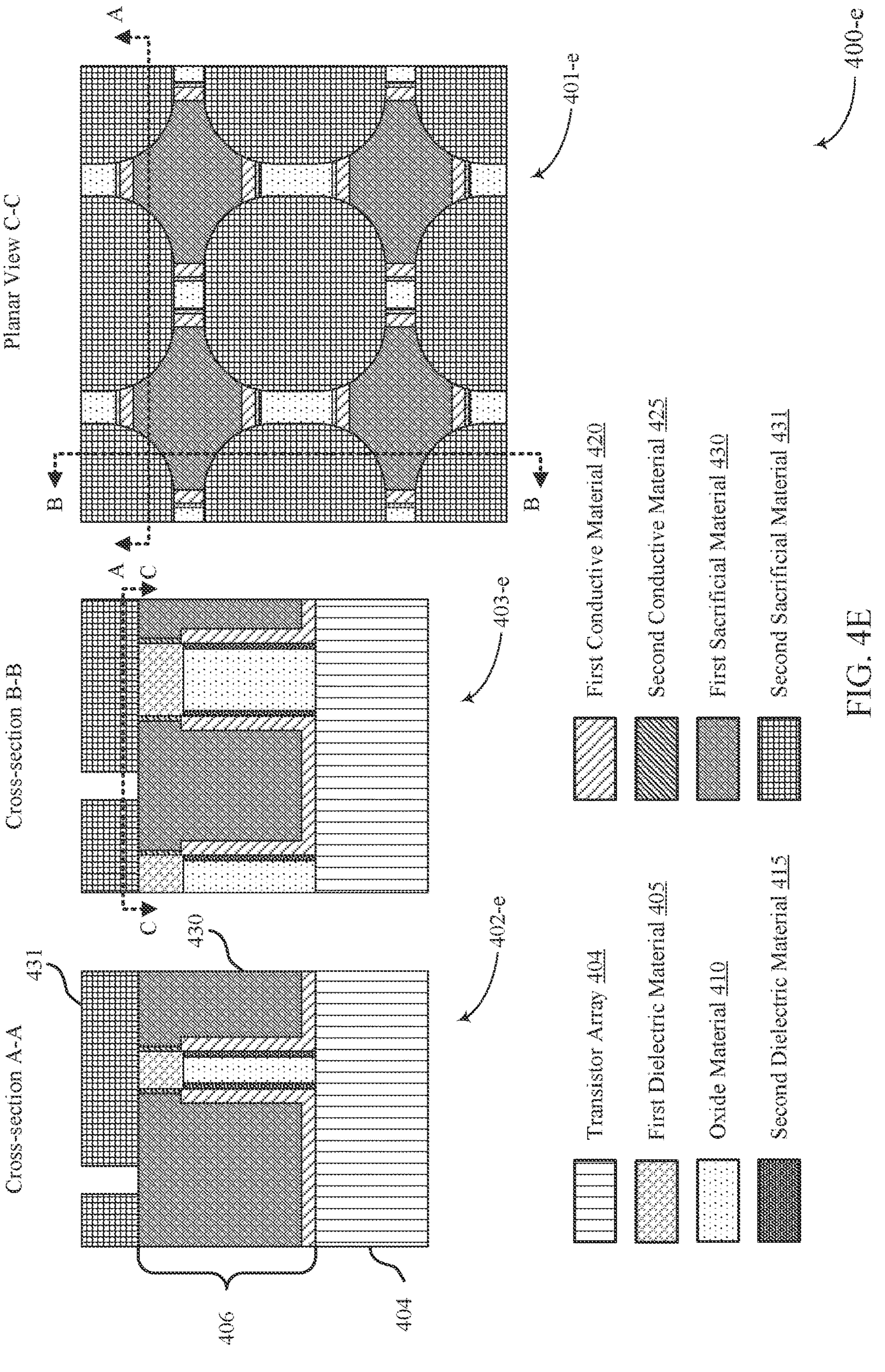

In FIG. 4E, processing step 400-*e* is depicted and includes a planar view 301-*e*, a horizontal cross-sectional view 402-*e*, and a vertical cross-sectional view 403-*e* of the ferroelectric memory architecture. The horizontal cross-sectional view 402-*e* is taken along the line A-A of the planar view 401-*e*, and the vertical cross-sectional view 403-*e* is taken along the line B-B of the planar view 401-*e*. Further, the planar view 401-*e* is taken along the line C-C of the vertical cross-sectional view 403-*e*. In the processing step 400-*e*, a first sacrificial material 430 may be deposited in the cavities 414 to reform the stack 406 of materials. A second sacrificial material 431 may be deposited over the stack 406 of materials.

Figure 4F:
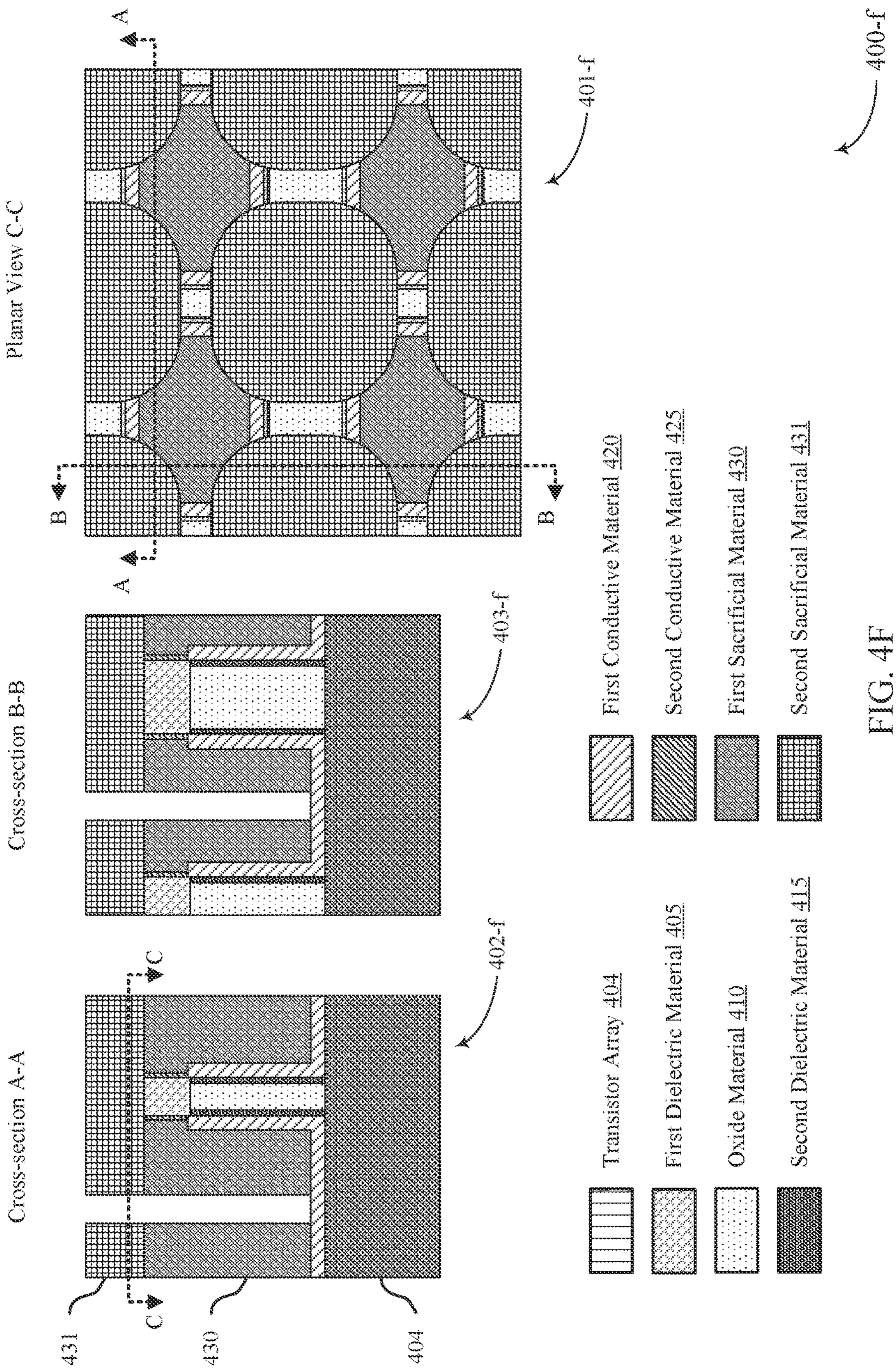

In FIG. 4F, processing step 400-*f* is depicted and includes a planar view 301-*f*, a horizontal cross-sectional view 402-*f*, and a vertical cross-sectional view 403-*f* of the ferroelectric memory architecture. The horizontal cross-sectional view 402-*f* is taken along the line A-A of the planar view 401-*f*, and the vertical cross-sectional view 403-*f* is taken along the line B-B of the planar view 401-*f*. Further, the planar view 401-*f* is taken along the line C-C of the horizontal cross-sectional view 402-*f*. In the processing step 400-*f*, the first sacrificial material 430 may be etched (e.g., using a wet etch process, using a dry etch process such as a carbon dry etch) to expose a portion of the first conductive material 420 in the set of cavities 414.

Figure 4G:
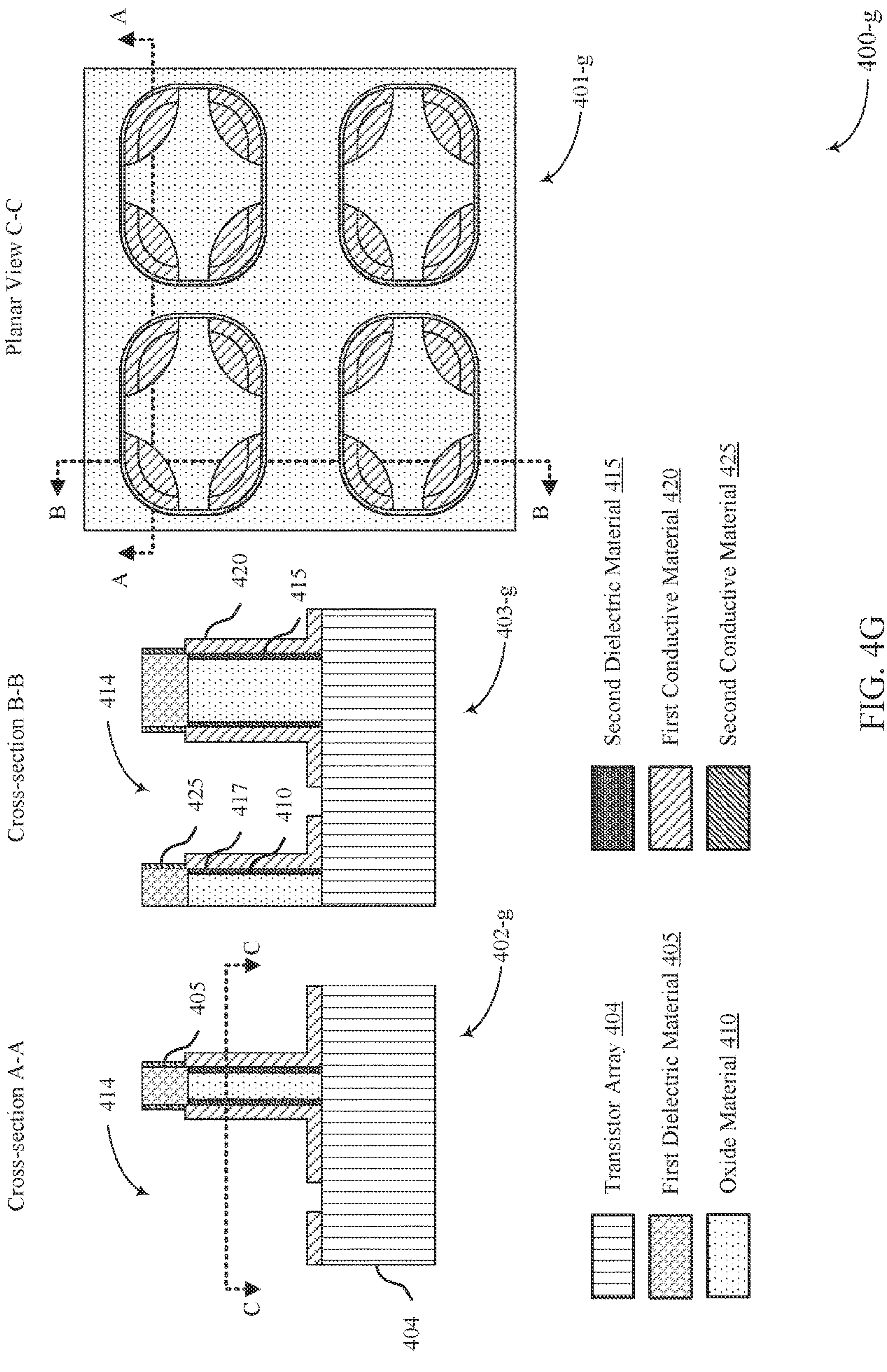

In FIG. 4G, processing step 400-*g* is depicted and includes a planar view 301-*g*, a horizontal cross-sectional view 402-*g*, and a vertical cross-sectional view 403-*g* of the ferroelectric memory architecture. The horizontal cross-sectional view 402-*g* is taken along the line A-A of the planar view 401-*g*, and the vertical cross-sectional view 403-*g* is taken along the line B-B of the planar view 401-*g*. Further, the planar view 401-*g* is taken along the line C-C of the horizontal cross-sectional view 402-*g*. In the processing step 400-*g*, the first sacrificial material 430 and the second sacrificial material 431 may be etched, and the exposed portion of the first conductive material 420 in the set of cavities 414 may be removed (e.g., using a wet etch process).

Figure 4H:
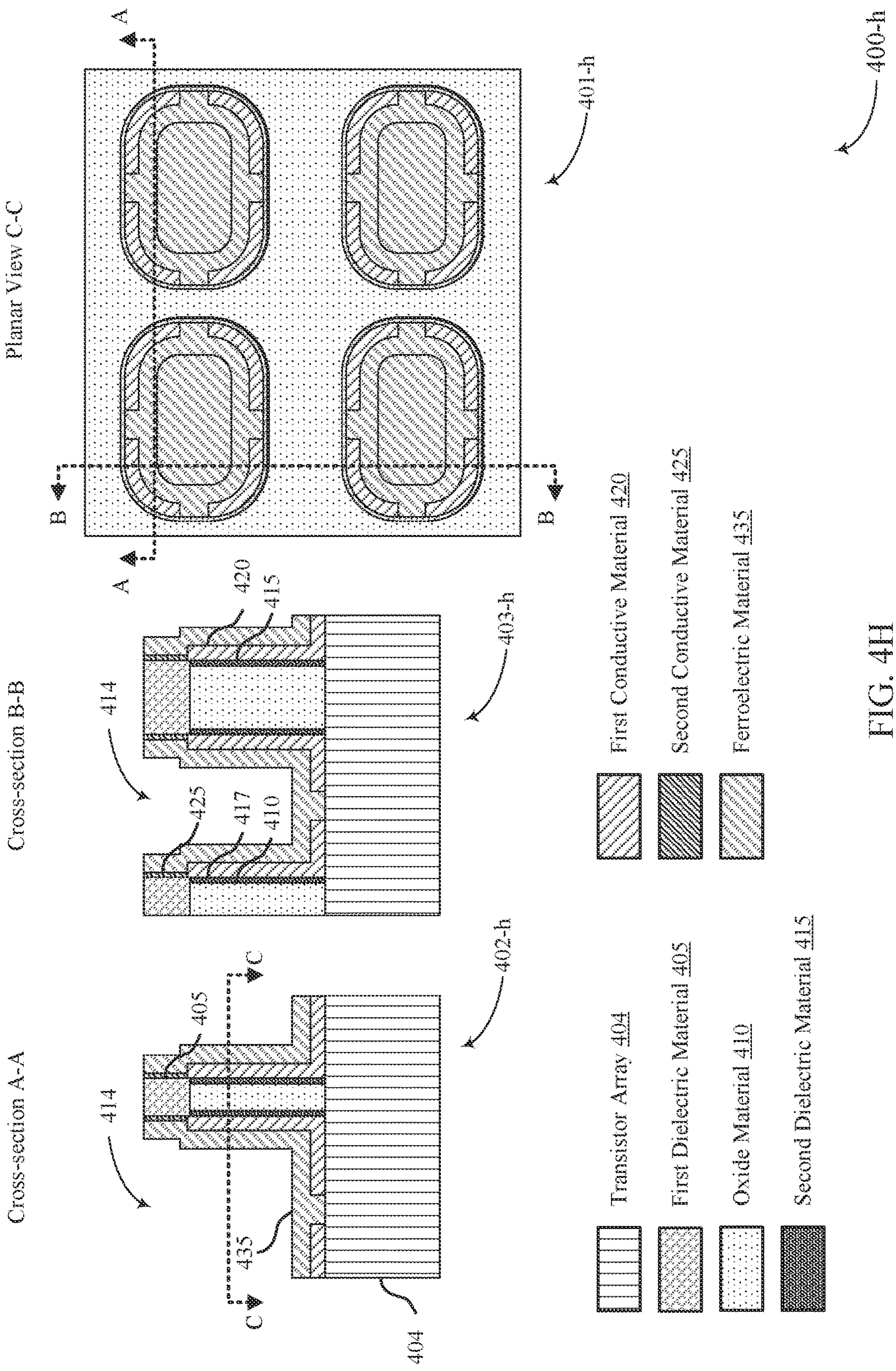

In FIG. 4H, processing step 400-*h* is depicted and includes a planar view 301-*h*, a horizontal cross-sectional view 402-*h*, and a vertical cross-sectional view 403-*h* of the ferroelectric memory architecture. The horizontal cross-sectional view 402-*h* is taken along the line A-A of the planar view 401-*h*, and the vertical cross-sectional view 403-*h* is taken along the line B-B of the planar view 401-*h*. Further, the planar view 401-*h* is taken along the line C-C of the horizontal cross-sectional view 402-*h*. In the processing step 400-*h*, a ferroelectric material 435 may be deposited in the set of cavities 414. In some examples, the deposition of the ferroelectric material 435 may be a uniform thickness (e.g., 6 nm). In some examples, the ferroelectric material 435 may be deposited over the first dielectric material 405 and then etched back to expose the first dielectric material 405.

Figure 4I:
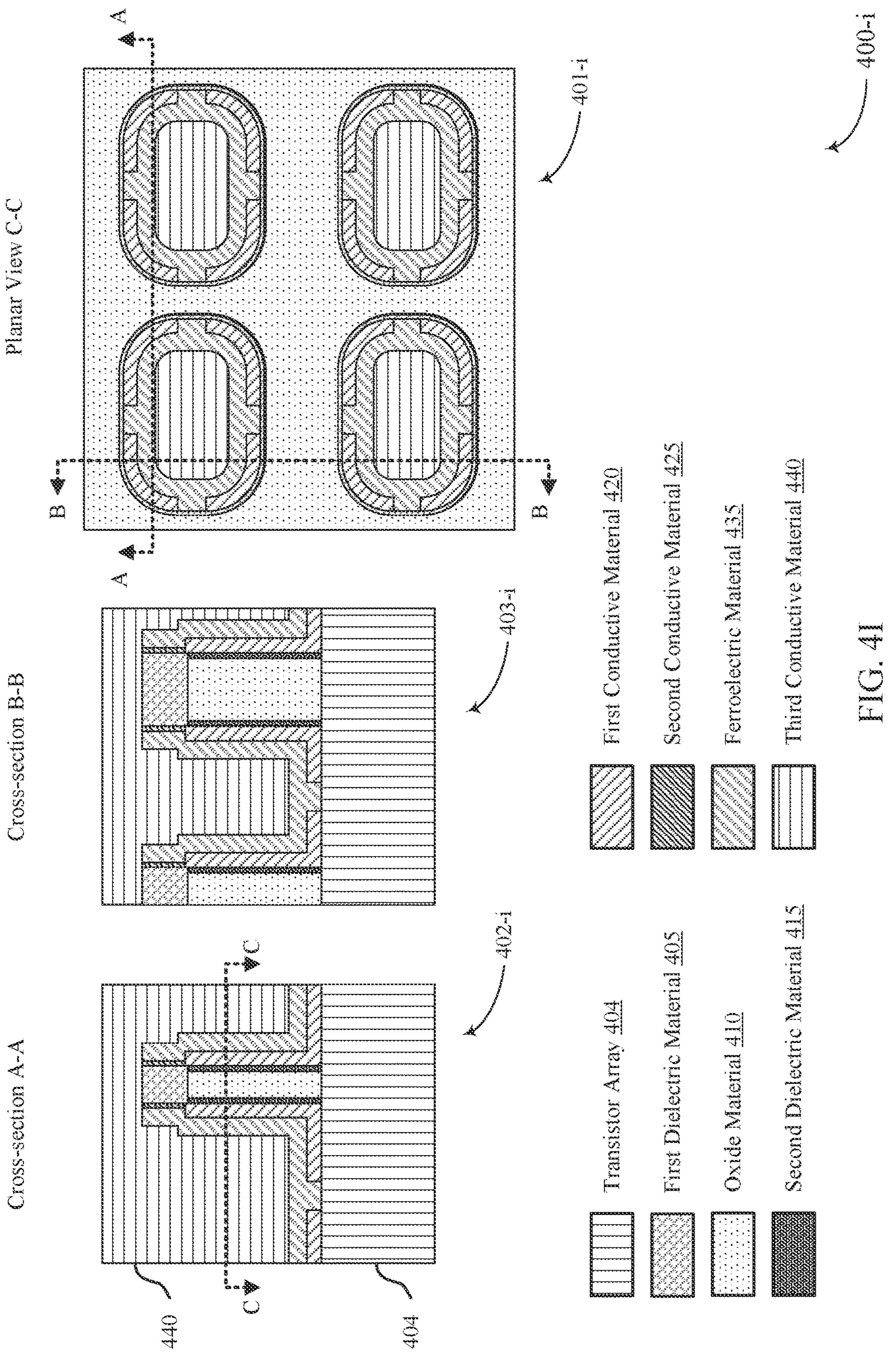

In FIG. 4I, processing step 400-*i* is depicted and includes a planar view 301-*i*, a horizontal cross-sectional view 402-*i*, and a vertical cross-sectional view 403-*i* of the ferroelectric memory architecture. The horizontal cross-sectional view 402-*i* is taken along the line A-A of the planar view 401-*i*, and the vertical cross-sectional view 403-*i* is taken along the line B-B of the planar view 401-*i*. Further, the planar view 401-*i* is taken along the line C-C of the horizontal cross-sectional view 402-*i*. In the processing step 400-*i*, a third conductive material 440 may be deposited in the set of cavities 414 and over the ferroelectric material 435 and the first dielectric material 405.

Figure 4J:
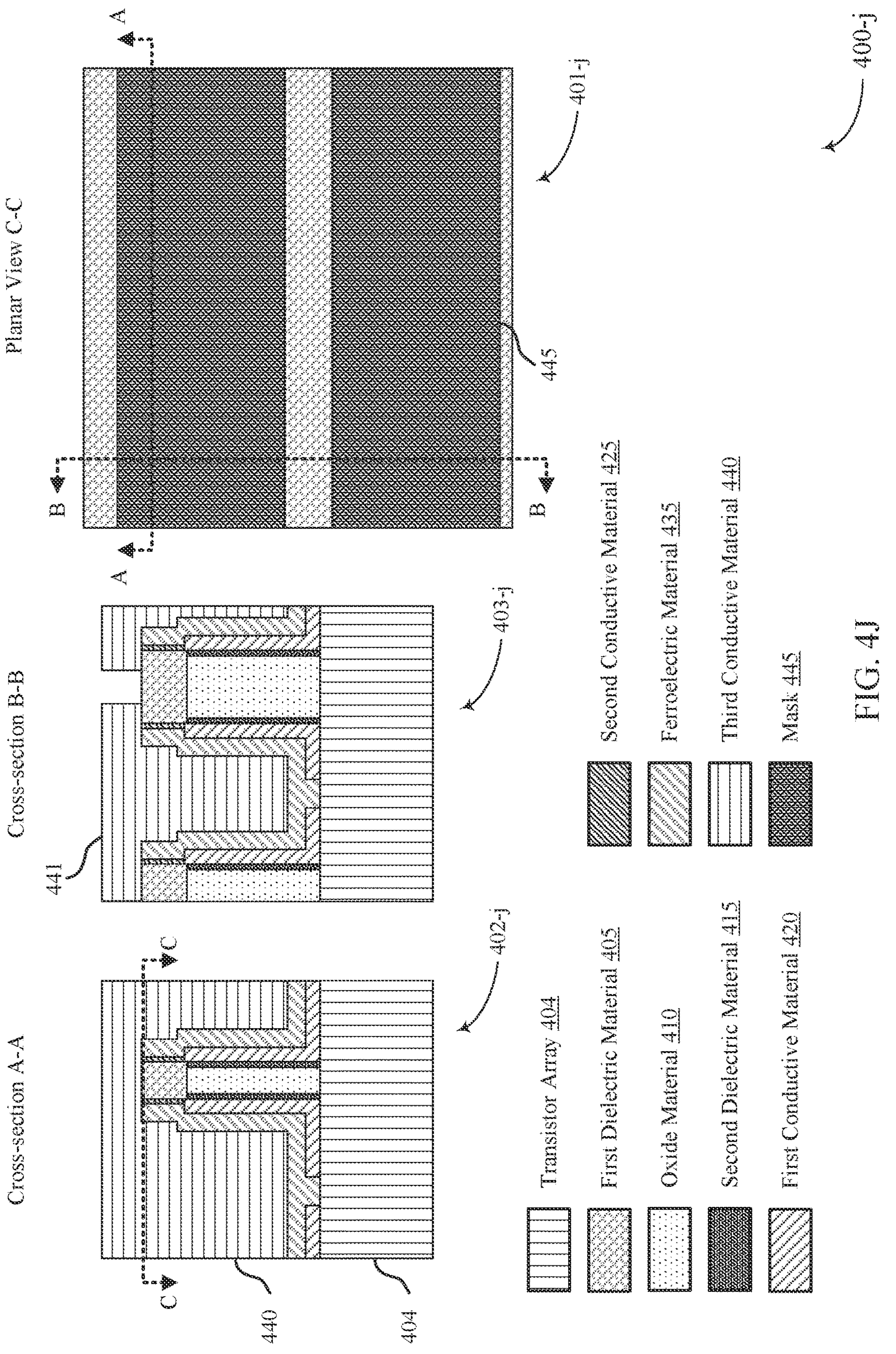

In FIG. 4J, processing step 400-*j* is depicted and includes a planar view 301-*j*, a horizontal cross-sectional view 402-*j*, and a vertical cross-sectional view 403-*j* of the ferroelectric memory architecture. The horizontal cross-sectional view 402-*j* is taken along the line A-A of the planar view 401-*j*, and the vertical cross-sectional view 403-*j* is taken along the line B-B of the planar view 401-*j*. Further, the planar view 401-*j* is taken along the line C-C of the horizontal cross-sectional view 402-*j*. In the processing step 400-*j*, a mask 445 (or a set of masks 445) may be placed (e.g., deposited) over a first portion of the third conductive material 440, leaving a second portion of the third conductive material 440 exposed. After the mask 445 is placed, the exposed second portion of the third conductive material 440 may be etched to separate the first portion of the third conductive material 440 into plates 441.

Figure 4K:
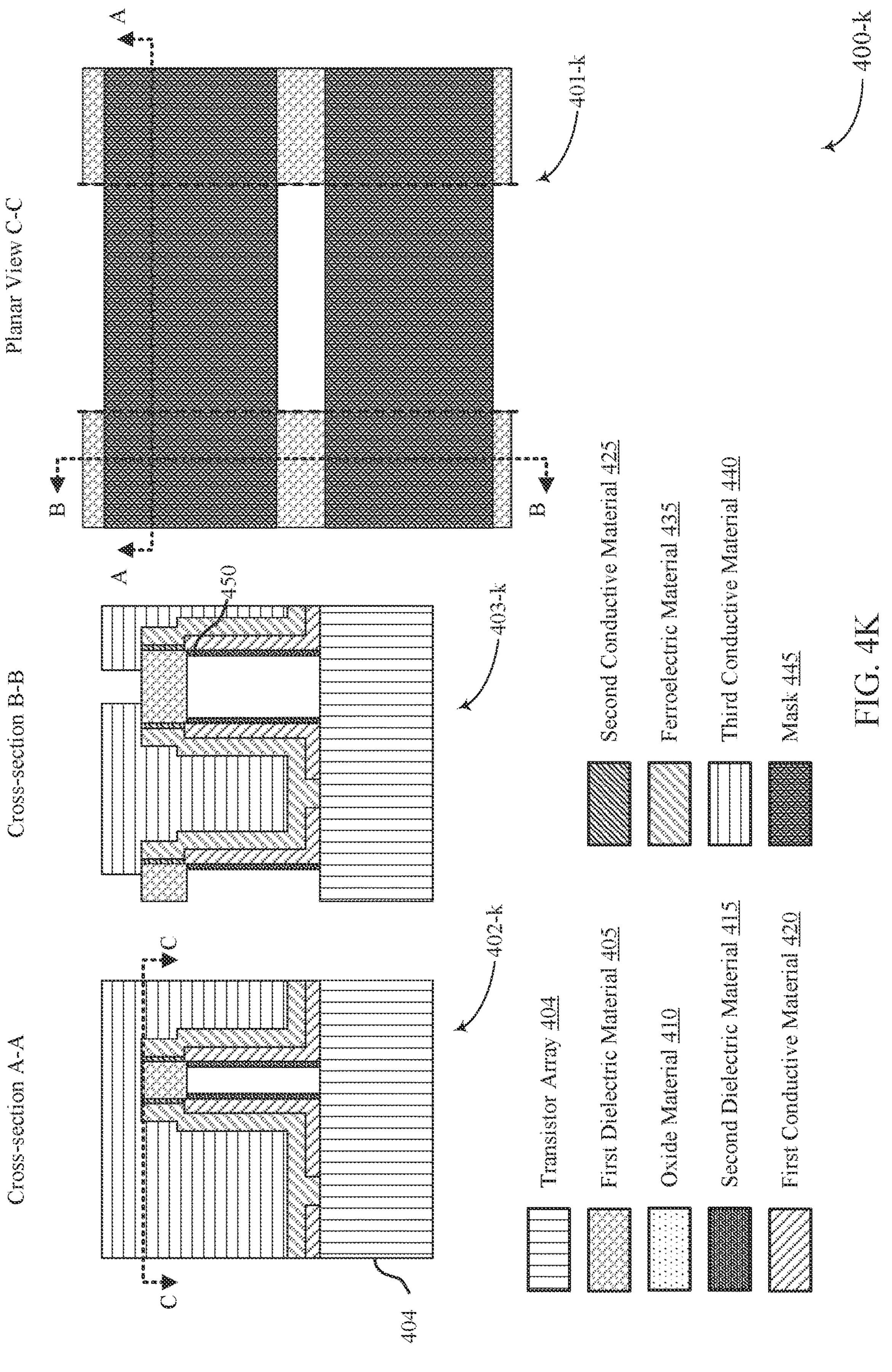

In FIG. 4K, processing step 400-*k* is depicted and includes a planar view 301-*k*, a horizontal cross-sectional view 402-*k*, and a vertical cross-sectional view 403-*k* of the ferroelectric memory architecture. The horizontal cross-sectional view 402-*k* is taken along the line A-A of the planar view 401-*k*, and the vertical cross-sectional view 403-*k* is taken along the line B-B of the planar view 401-*k*. Further, the planar view 401-*k* is taken along the line C-C of the horizontal cross-sectional view 402-*k*. In the processing step 400-*k*, a second mask (e.g., a print mask) may be placed over the stack 406 of materials, and the first dielectric material 405 may be etched (e.g., using a dry etch process) to expose the oxide material 410. The oxide material 410 may be removed to form a gap region 450 between the sidewalls 417. In some examples, the oxide material 410 may be removed using a wet etch process or a wet exhume process to create a void (e.g., the gap region 450) between the sidewalls 417.

Figure 4L:
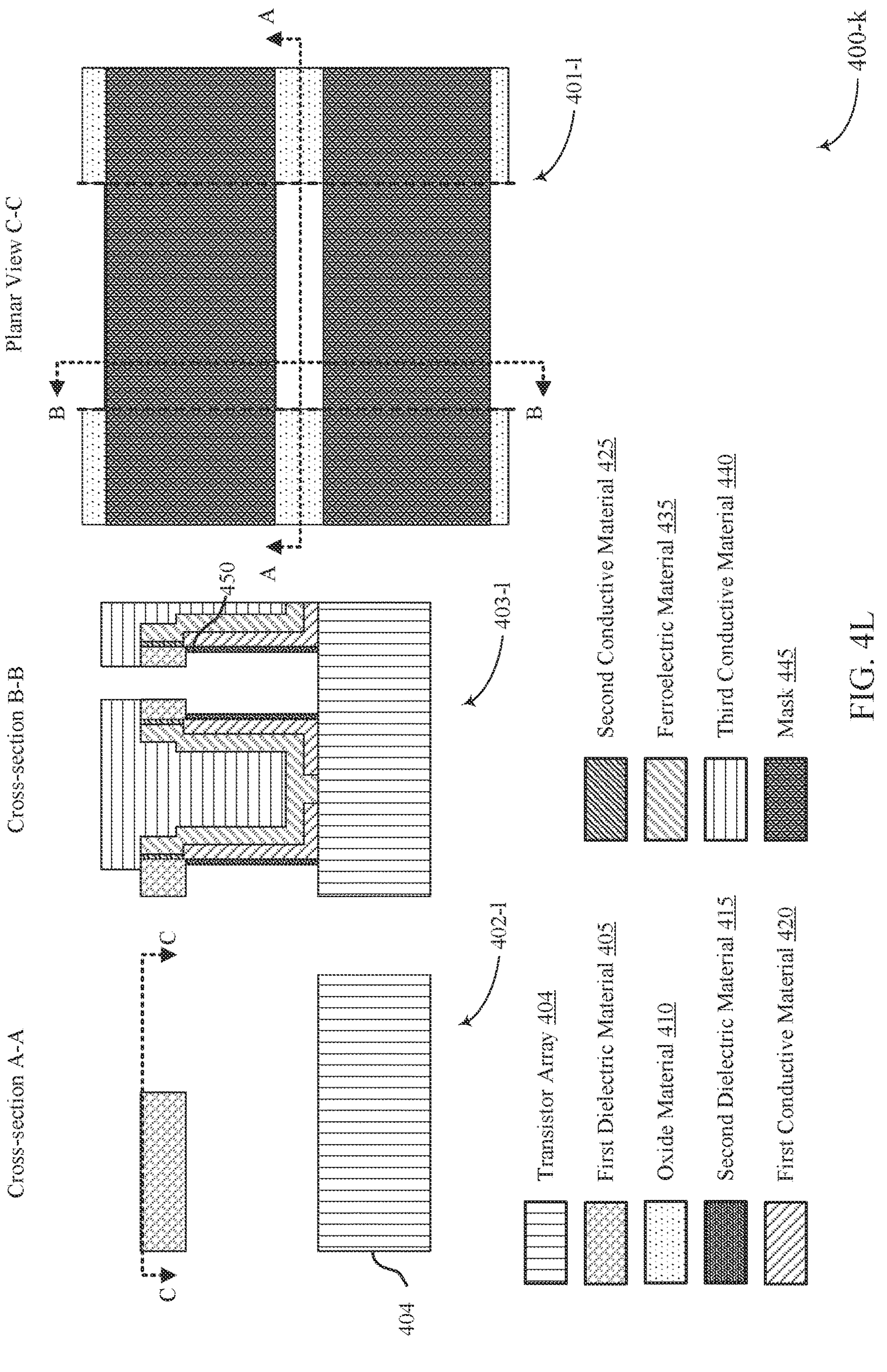

In FIG. 4L, the processing step 400-*k* is depicted with alternative views. For example, FIG. 4L includes a planar view 301-1, a horizontal cross-sectional view 402-1, and a vertical cross-sectional view 403-1 of the ferroelectric memory architecture. The horizontal cross-sectional view 402-1 is taken along the line A-A of the planar view 401-1, and the vertical cross-sectional view 403-1 is taken along the line B-B of the planar view 401-1. Further, the planar view 401-1 is taken along the line C-C of the horizontal cross-sectional view 402-1. As illustrated in FIG. 4L, the first dielectric material 405 may be etched (e.g., using a dry etch process) to expose the oxide material 410. The oxide material 410 may be removed to form a gap region 450 between the sidewalls 417. In some examples, the substance such as the fluid (e.g., air) in the gap region 450 may have a relatively low dielectric constant to reduce a capacitance between the plates 441 and reduce (e.g., eliminate) undesirable coupling between the plates 441 during memory operations.

Figure 5:
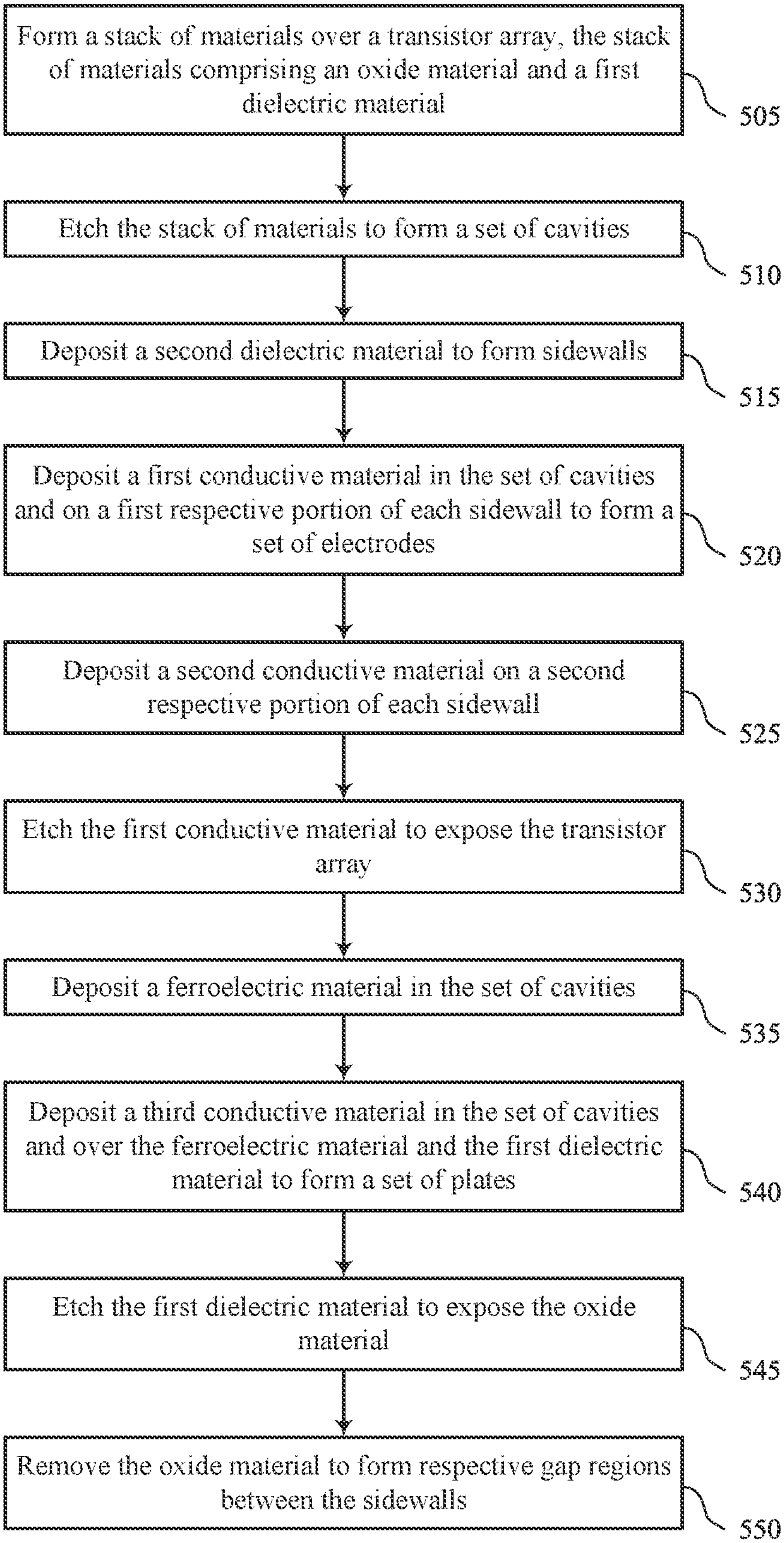
FIG. 5 shows a flowchart illustrating a method or methods that support a ferroelectric memory architecture in accordance with examples as disclosed herein.

FIG. 5 shows a flowchart illustrating a method 500 that supports a ferroelectric memory architecture in accordance with examples as disclosed herein. The operations of method 500 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 505, the method may include forming a stack of materials over a transistor array, the stack of materials including an oxide material and a first dielectric material. The operations of 505 may be performed in accordance with examples as disclosed herein.

At 510, the method may include etching the stack of materials to form a set of cavities. The operations of 510 may be performed in accordance with examples as disclosed herein.

At 515, the method may include depositing a second dielectric material to form sidewalls. The operations of 515 may be performed in accordance with examples as disclosed herein.

At 520, the method may include depositing a first conductive material in the set of cavities and on a first respective portion of each sidewall to form a set of electrodes. The operations of 520 may be performed in accordance with examples as disclosed herein.

At 525, the method may include depositing a second conductive material on a second respective portion of each sidewall. The operations of 525 may be performed in accordance with examples as disclosed herein.

At 530, the method may include etching the first conductive material to expose the transistor array. The operations of 530 may be performed in accordance with examples as disclosed herein.

At 535, the method may include depositing a ferroelectric material in the set of cavities. The operations of 535 may be performed in accordance with examples as disclosed herein.

At 540, the method may include depositing a third conductive material in the set of cavities and over the ferroelectric material and the first dielectric material to form a set of plates. The operations of 540 may be performed in accordance with examples as disclosed herein.

At 545, the method may include etching the first dielectric material to expose the oxide material. The operations of 545 may be performed in accordance with examples as disclosed herein.

At 550, the method may include removing the oxide material to form respective gap regions between the sidewalls. The operations of 550 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a stack of materials over a transistor array, the stack of materials including an oxide material and a first dielectric material; etching the stack of materials to form a set of cavities; depositing a second dielectric material to form sidewalls; depositing a first conductive material in the set of cavities and on a first respective portion of each sidewall to form a set of electrodes; depositing a second conductive material on a second respective portion of each sidewall; etching the first conductive material to expose the transistor array; depositing a ferroelectric material in the set of cavities; depositing a third conductive material in the set of cavities and over the ferroelectric material and the first dielectric material to form a set of plates; etching the first dielectric material to expose the oxide material; and removing the oxide material to form respective gap regions between the sidewalls.

Aspect 2: The method or apparatus of aspect 1 where depositing the second dielectric material, further includes operations, features, circuitry, logic, means, or instructions, or any combination thereof for depositing the second dielectric material in the set of cavities.

Aspect 3: The method or apparatus of aspect 2, further including operations, features, circuitry, logic, means, or instructions, or any combination thereof for etching the second dielectric material to reform the set of cavities and the sidewalls, each sidewall including the second dielectric material.

Aspect 4: The method or apparatus of any of aspects 1 through 3 where depositing the first conductive material to form the set of electrodes, further includes operations, features, circuitry, logic, means, or instructions, or any combination thereof for depositing the first conductive material in the set of cavities, on the sidewalls, and over the first dielectric material.

Aspect 5: The method or apparatus of aspect 4, further including operations, features, circuitry, logic, means, or instructions, or any combination thereof for etching the first conductive material to expose the first dielectric material and expose the respective second portion of each sidewall, where depositing the second conductive material is based at least in part on etching the first conductive material.

Aspect 6: The method or apparatus of any of aspects 1 through 5, further including operations, features, circuitry, logic, means, or instructions, or any combination thereof for depositing a first sacrificial material in the set of cavities to reform the stack of materials after depositing the second conductive material and etching the first sacrificial material to expose a portion of the first conductive material in the set of cavities, where etching the portion of the first conductive material to expose the transistor array is based at least in part on etching the first sacrificial material.

Aspect 7: The method or apparatus of aspect 6, further including operations, features, circuitry, logic, means, or instructions, or any combination thereof for depositing a second sacrificial material over the stack of materials, where etching the first sacrificial material to expose the portion of the first conductive material is based at least in part on depositing the second sacrificial material and etching the first sacrificial material and the second sacrificial material to reform the set of cavities.

Aspect 8: The method or apparatus of any of aspects 1 through 7 where depositing the ferroelectric material, further includes operations, features, circuitry, logic, means, or instructions, or any combination thereof for depositing the ferroelectric material in the set of cavities and over the first dielectric material.

Aspect 9: The method or apparatus of aspect 8, further including operations, features, circuitry, logic, means, or instructions, or any combination thereof for etching the ferroelectric material to expose the first dielectric material.

Aspect 10: The method or apparatus of any of aspects 1 through 9 where forming the set of plates, further includes operations, features, circuitry, logic, means, or instructions, or any combination thereof for depositing a mask over the stack of materials after depositing the third conductive material and etching the third conductive material to form the set of plates based at least in part on depositing the mask.

Aspect 11: The method or apparatus of any of aspects 1 through 10 where the oxide material is removed using a wet exhume process.

Aspect 12: The method or apparatus of any of aspects 1 through 11 where each gap region includes a fluid. In some examples, the gap region may alternatively include another substances, such as a material. In some examples, the material may be a non-fluid (e.g., may be a solid) and may be a material having a relatively lower dielectric constant compared to at least some if not all of the other materials in the apparatus.

Aspect 13: The method or apparatus of any of aspects 1 through 12 where the first dielectric material forms a respective cap over each gap region.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 14: An apparatus, including: a first memory cell coupled with a first access line and a first plate line; a second memory cell coupled with a second access line and a second plate line; a first sidewall and a second sidewall between the first memory cell and the second memory cell, the first and second sidewalls including a first dielectric material and separated by a gap region; and a cap over the first sidewall, the second sidewall, and the gap region, the cap including a second dielectric material.

Aspect 15: The apparatus of aspect 14, further including: a third memory cell coupled with a third access line and the first plate line; and a word line coupled with the first memory cell and the third memory cell.

Aspect 16: The apparatus of any of aspects 14 through 15, further including: a transistor array below the first memory cell and the second memory cell.

Aspect 17: The apparatus of aspect 16, where the transistor array includes: a first transistor configured to couple the first access line with a sense amplifier; and a second transistor configured to couple the second access line with the sense amplifier.

Aspect 18: The apparatus of any of aspects 14 through 17, where the first memory cell includes: a ferroelectric material; a first electrode configured to couple the ferroelectric material with the first access line; and a second electrode configured to couple the ferroelectric material with the first plate line.

Aspect 19: The apparatus of any of aspects 14 through 18, where: the first access line includes a first digit line; and the second access line includes a second digit line.

Aspect 20: The apparatus of any of aspects 14 through 19, where the gap region includes a fluid.

An apparatus is described. The following provides an overview of aspects of the apparatus as described herein:

Aspect 21: An apparatus, including: a first pair of memory cells configured to store a single logic state and including a first memory cell and a second memory cell; a second pair of memory cells configured to store a single logic state and including a third memory cell and a fourth memory cell; a first sidewall and a second sidewall between the first pair of memory cells and the second pair of memory cells, the first and second sidewalls including a first dielectric material and separated by a gap region; and a cap over the first sidewall, the second sidewall, and the gap region, the cap including a second dielectric material.

Aspect 22: The apparatus of aspect 21, further including: a first access line coupled with the first memory cell of the first pair of memory cells; and a second access line coupled with the second memory cell of the first pair of memory cells.

Aspect 23: The apparatus of any of aspects 21 through 22, further including: a first plate line coupled with the first pair of memory cells; and a second plate line coupled with the second pair of memory cells.

Aspect 24: The apparatus of any of aspects 21 through 23, further including: a transistor array below the first pair of memory cells and the second pair of memory cells.

Aspect 25: The apparatus of any of aspects 21 through 24, where the gap region includes a fluid.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, “or” as used in a list of items (for example, a list of items prefaced by a phrase such as “at least one of” or “one or more of”) indicates an inclusive list such that, for example, a list of at least one of A, B, or C means A or B or C or AB or AC or BC or ABC (i.e., A and B and C). Also, as used herein, the phrase “based on” shall not be construed as a reference to a closed set of conditions. For example, an exemplary step that is described as “based on condition A” may be based on both a condition A and a condition B without departing from the scope of the present disclosure. In other words, as used herein, the phrase “based on” shall be construed in the same manner as the phrase “based at least in part on.”

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
- a first memory cell comprising a first capacitor, the first memory cell coupled with a first access line and a first plate line;
- a second memory cell comprising a second capacitor, the second memory cell coupled with a second access line and a second plate line;
- a first sidewall around the first capacitor and a second sidewall around the second capacitor, the first sidewall and the second sidewall each comprising a first dielectric material, and the first sidewall and the second sidewall separated by a gap region between the first sidewall and the second sidewall; and
- a cap over the first sidewall, the second sidewall, and the gap region, the cap comprising a second dielectric material in contact with the first sidewall and the second sidewall.

2. The apparatus of claim 1, further comprising:
- a third memory cell coupled with a third access line and the first plate line; and
- a word line coupled with the first memory cell and the third memory cell.

3. The apparatus of claim 1, further comprising:
- a transistor array below the first memory cell and the second memory cell.

4. The apparatus of claim 3, wherein the transistor array comprises:
- a first transistor configured to couple the first access line with a sense amplifier; and
- a second transistor configured to couple the second access line with the sense amplifier.

5. The apparatus of claim 1, wherein the first capacitor and second capacitor each comprise:
- a ferroelectric material;
- a first electrode configured to couple the ferroelectric material with the first access line; and
- a second electrode configured to couple the ferroelectric material with the first plate line.

6. The apparatus of claim 1, wherein:
- the first access line comprises a first digit line; and
- the second access line comprises a second digit line.

7. The apparatus of claim 1, wherein the gap region comprises a void between the first sidewall and the second sidewall.

8. The apparatus of claim 1, wherein:
- the first dielectric material has a first dielectric constant; and
- the gap region comprises a substance having a second dielectric constant that is lower than the first dielectric constant corresponding to the first dielectric material.

9. The apparatus of claim 8, wherein the gap region comprises a fluid substance between the first sidewall and the second sidewall.

10. The apparatus of claim 9, wherein the fluid substance comprises air.

11. An apparatus, comprising:
- a first pair of memory cells configured to store a single logic state and comprising a first memory cell and a second memory cell;
- a second pair of memory cells configured to store a single logic state and comprising a third memory cell and a fourth memory cell;
- a first sidewall and a second sidewall between the first pair of memory cells and the second pair of memory cells, the first and second sidewalls comprising a first dielectric material and separated by a gap region; and
- a cap over the first sidewall, the second sidewall, and the gap region, the cap comprising a second dielectric material.

12. The apparatus of claim 11, further comprising:
- a first access line coupled with the first memory cell of the first pair of memory cells; and
- a second access line coupled with the second memory cell of the first pair of memory cells.

13. The apparatus of claim 11, further comprising:
- a first plate line coupled with the first pair of memory cells; and a second plate line coupled with the second pair of memory cells.

14. The apparatus of claim 11, further comprising:

a transistor array below the first pair of memory cells and the second pair of memory cells.

15. The apparatus of claim 11, wherein the gap region comprises a void between the first sidewall and the second sidewall.

16. The apparatus of claim 11, wherein:

the first dielectric material has a first dielectric constant; and the gap region comprises a substance having a second dielectric constant that is lower than the first dielectric constant corresponding to the first dielectric material.

17. The apparatus of claim 16, wherein the gap region comprises a fluid substance between the first sidewall and the second sidewall.

18. The apparatus of claim 17, wherein the fluid substance comprises air.

* * * * *